US008665623B2

(12) United States Patent
Suzuki et al.

(10) Patent No.: US 8,665,623 B2
(45) Date of Patent: Mar. 4, 2014

(54) POWER CONVERTER DESIGNED TO ENHANCE STABILITY IN OPERATION

(71) Applicant: Denso Corporation, Kariya (JP)

(72) Inventors: Tomotaka Suzuki, Nagoya (JP); Tsuneo Maebara, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 13/622,500

(22) Filed: Sep. 19, 2012

(65) Prior Publication Data

US 2013/0070502 A1      Mar. 21, 2013

(30) Foreign Application Priority Data

Sep. 19, 2011    (JP) ................................. 2011-203975

(51) Int. Cl.
*H02M 1/00*    (2007.01)
(52) U.S. Cl.
USPC ......................................................... 363/141
(58) Field of Classification Search
USPC ............. 363/131, 132, 141, 144; 307/9.1, 82; 361/689, 699
See application file for complete search history.

(56) References Cited

U.S. PATENT DOCUMENTS

| | | | | |
|---|---|---|---|---|
| 5,517,401 | A * | 5/1996 | Kinoshita et al. ................ | 363/98 |
| 8,324,691 | B2 * | 12/2012 | Hirose et al. ................... | 257/378 |
| 8,342,276 | B2 * | 1/2013 | Murakami .................. | 180/65.31 |
| 8,373,300 | B2 * | 2/2013 | Nakatsu et al. ................. | 307/9.1 |
| 8,376,069 | B2 * | 2/2013 | Nakatsu et al. ............. | 180/65.21 |
| 2010/0001692 | A1 * | 1/2010 | Takahashi ...................... | 320/132 |
| 2010/0050676 | A1 * | 3/2010 | Takamatsu et al. ........... | 62/259.2 |
| 2010/0326750 | A1 * | 12/2010 | Murakami .................. | 180/65.31 |
| 2011/0198924 | A1 * | 8/2011 | Yamaki et al. ................... | 307/31 |
| 2011/0241198 | A1 * | 10/2011 | Azuma .......................... | 257/696 |
| 2012/0275205 | A1 * | 11/2012 | Nakatsu et al. ............... | 363/141 |
| 2013/0128645 | A1 * | 5/2013 | Nakatsu et al. ............... | 363/141 |
| 2013/0128646 | A1 * | 5/2013 | Nishihara et al. ............. | 363/141 |

FOREIGN PATENT DOCUMENTS

| | | |
|---|---|---|
| JP | 11-235043 | 8/1999 |
| JP | 2010-124523 | 6/2010 |

* cited by examiner

*Primary Examiner* — Adolf Berhane
(74) *Attorney, Agent, or Firm* — Nixon & Vanderhye P.C.

(57) ABSTRACT

A power converter equipped with a plurality of semiconductor modules, a cooling device, a control circuit board, a smoothing capacitor, and a discharging resistor. The discharging resistor mounted on the control circuit board in parallel connection to the smoothing capacitor. The control circuit board has fabricated thereon a timing controller working to control timings of on/off operations of the semiconductor modules, a driver coupled to control terminals of the semiconductor modules to control voltage applied to the control terminals, and a power supply circuit working to transform a voltage input to the control circuit board into operating voltages for the timing controller and the driver. The driver is disposed between at least one of the timing controller and the power supply circuit and the discharging resistor, thereby protecting the timing controller and/or the power supply circuit mounted on the control circuit board from thermal energy radiating from the discharging resistor.

9 Claims, 12 Drawing Sheets

POWER CONVERTER DESIGNED TO ENHANCE STABILITY IN OPERATION

CROSS REFERENCE TO RELATED DOCUMENT

The present application claims the benefit of priority of Japanese Patent Application No. 2011-203975 filed on Sep. 19, 2011, the disclosure of which is incorporated herein by reference.

BACKGROUND

1. Technical Field This application relates generally to a power converter which is equipped with a discharging resistor and designed to enhance the stability in operation thereof.

2. Background Art

Power converters are known which work to perform power conversion between DC power and AC power and are equipped with a smoothing capacitor and a discharging resistor for releasing electric charge stored in the smoothing capacitor. For instance, Japanese Patent First Publication Nos. 2010-124523 and 11-235043 teach such a type of power converter. FIG. 13 illustrates an example of a conventional power converter.

The power converter 9 consists of a plurality of semiconductor modules 90 in which semiconductor devices are installed. Each of the semiconductor modules 90 includes control terminals 99 and power terminals 920. The control terminals 99 are joined to a control circuit board 93. The control circuit board 93 has fabricated thereon electronic parts working to control switching operations of the semiconductor modules 90.

A smoothing capacitor 95 is coupled to the power terminals 920 of the semiconductor modules 90 to smooth DC voltage. A discharging resistor 96 is connected in parallel to the smoothing capacitor 95.

The discharging resistor 96 is mounted on the control circuit board, thereby eliminating a space required to secure the discharge resistor 96 directly to a housing or casing 97 to reduce the overall size of the power converter 9.

Upon turning on of the power converter 9, electric charge is stored in the smoothing capacitor 95. After the power converter 9 is turned off, the electric charge is released from the smoothing capacitor 95 through the discharging resistor 96, thereby lowering the voltage at the smoothing capacitor in a decreased time to minimize the risk of electrical shock.

Upon discharging of the smoothing capacitor 95, the electric current flows through the discharging resistor 96 mounted on the control circuit board 93, heating it. This may cause a portion of the circuit on the control circuit board which is susceptible to heat to be thermally damaged by the discharging resistor 96, which leads to a malfunction of the circuit on the control circuit board 93.

SUMMARY

It is therefore an object of this disclosure to provide an improved structure of a power converter which is designed to minimize the risk of a malfunction of an electric circuit fabricated on a control circuit board.

According to one aspect of an embodiment, there is provided a power converter which may be employed in automotive vehicles such as electric cars or hybrid cars. The power converter comprises: (a) a plurality of semiconductor modules each of which includes a main unit, control terminals, and power terminals, the main unit having a semiconductor device disposed therein, the control and power terminals protruding from the main unit; (b) a cooling device which works to cool the semiconductor modules; (c) a smoothing capacitor which works to smooth a dc voltage applied to the semiconductor modules; (d) a control circuit board; (e) a discharging resistor mounted on the control circuit board in parallel connection to the smoothing capacitor; (f) a timing controller disposed on the control circuit board, the timing controller working to control timings of on/off operations of the semiconductor modules; (g) a driver coupled to the control terminals of the semiconductor modules to control voltage applied to the control terminals; and (h) a power supply circuit disposed on the control circuit board. The power supply circuit works to transform a voltage input to the control circuit board into operating voltages for the timing controller and the driver. The driver is disposed between at least one of the timing controller and the power supply circuit and the discharging resistor, thereby protecting the timing controller and/or the power supply circuit mounted on the control circuit board from thermal energy radiating from the discharging resistor.

Specifically, the driver is joined to the control terminals of the semiconductor modules which are cooled by the cooling device, so that the temperature of the driver is kept at a relatively low level, while the timing controller and the power supply circuit do not lead to the control terminals, so that the temperature thereof will be elevated more easily than the driver. Accordingly, the driver is disposed between at least one of the timing controller and the power supply circuit and the discharging resistor to serve as a thermal shield to protect the timing controller and/or the power supply circuit from the heat, as produced by the discharging resistor. This minimizes the probability of thermal malfunction of or damage to the timing controller and/or the power supply circuit.

If the discharging resistor is mounted in a converter casing, it will be necessary to increase the volume of the converter casing to secure an installation space for the discharging resistor, thus resulting in an increase in overall size of the power converter. The power converter is, as described above, designed to have the discharging resistor disposed on the control circuit board, thus eliminating the need for the installation space and permitting the power converter to be reduced in size.

The driver may be located between the timing controller and the discharging resistor and between the power supply circuit and the discharging resistor, thereby protecting both the timing controller and the driver from the heat, as produced by the discharging resistor. This further minimizes the probability of thermal malfunction of or damage to the timing controller and/or the power supply circuit.

The timing controller may be equipped with a microcomputer. The driver may be disposed between the microcomputer and the discharging resistor. The microcomputer is usually sensitive to heat. The driver, thus, serves to protect the microcomputer from the thermal energy radiated by the discharging resistor, thus reducing the probability of malfunction of the control circuit board.

The power supply circuit may include an electrolytic capacitor which is sensitive to heat. The driver may be mounted between the electrolytic capacitor and the discharging resistor, thus protecting the electrolytic capacitor from the thermal energy radiated by the discharging resistor and reducing the probability of malfunction of the control circuit board.

The control circuit board has opposed major surfaces. The discharging resistor may be mounted on one of the major surfaces of the control circuit board which is closer to the cooling device than the other is. In other words, the discharging resistor is located close to the cooling device, thereby enhancing the efficiency in cooling the discharging resistor to minimize the adverse effects on the control circuit board which arises from the radiation of heat from the discharging resistor.

The discharging resistor may be laid to at least partially overlap the cooling device in a thickness-wise direction of the control circuit board. This permits the distance between the discharging resistor and the cooling device to be minimized, thereby facilitating the cooling of the discharging resistor to minimize the adverse effects on the control circuit board which arises from the radiation of heat from the discharging resistor.

The cooling device may include an inlet pipe to which coolant is supplied for cooling the semiconductor modules and an outlet pipe from which the coolant is discharged. The discharging resistor may be laid to at least partially overlap the inlet pipe in a thickness-wise direction of the control circuit board. This facilitates the cooling of the discharging resistor. Specifically, after entering the inlet pipe, the coolant flows through the cooling device to absorb the thermal energy from the semiconductor modules and, after being elevated in temperature, goes outside the cooling device through the outlet pipe. The temperature of the coolant is, therefore, minimized in the inlet pipe, while it is maximized in the outlet pipe. The discharging resistor of the power converter is, thus, disposed to overlap the inlet pipe near a place where the temperature of the coolant is the lowest, thereby enhancing the efficiency in cooling the discharging resistor.

The power converter may also include a semiconductor stack made up of the semiconductor modules and a plurality of cooling paths through which coolant flows to cool the semiconductor modules. The cooling paths constitute the cooling device. The control circuit board is laid in parallel both to a direction in which the semiconductor modules and the cooling paths are stacked and to a lengthwise direction of the cooling paths. Specifically, the control circuit board is located close both to the semiconductor modules and to the cooling device (i.e., the cooling paths), thereby facilitating the ease with which the control circuit board is joined to the control terminals of the semiconductor modules and having the discharging resistor located close to the cooling device, thereby enhancing the efficiency in cooling the discharging resistor. The discharging resistor may be laid to overlap one of the cooling paths in a thickness-wise direction of the control circuit board. The one of the cooling paths is an outermost one of the cooling paths in the direction in which the semiconductor modules and the cooling paths are stacked. Specifically, the outermost cooling path has only one side area abutting the semiconductor modules, so that it undergoes less thermal effects than the other cooling paths which are exposed directly at both side areas thereof to the semiconductor modules. The temperature of the coolant in the outmost cooling path is, therefore, less elevated, thus enhancing the efficiency in cooling the discharging resistor disposed close to the outermost cooling path.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENTS

Figure 4:
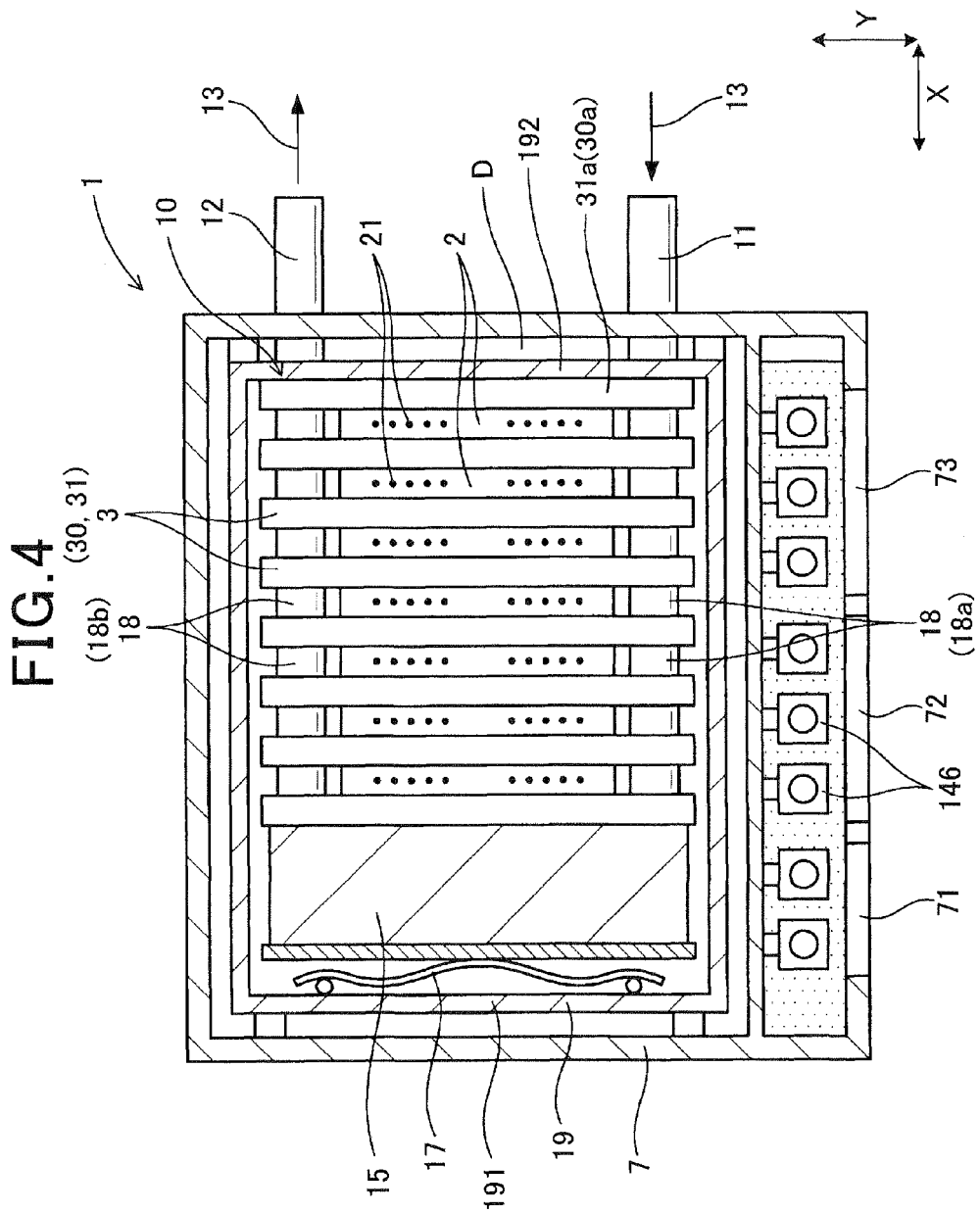
FIG. 4 is a sectional view taken along the line D-D in FIG. 2.
Figure 5:
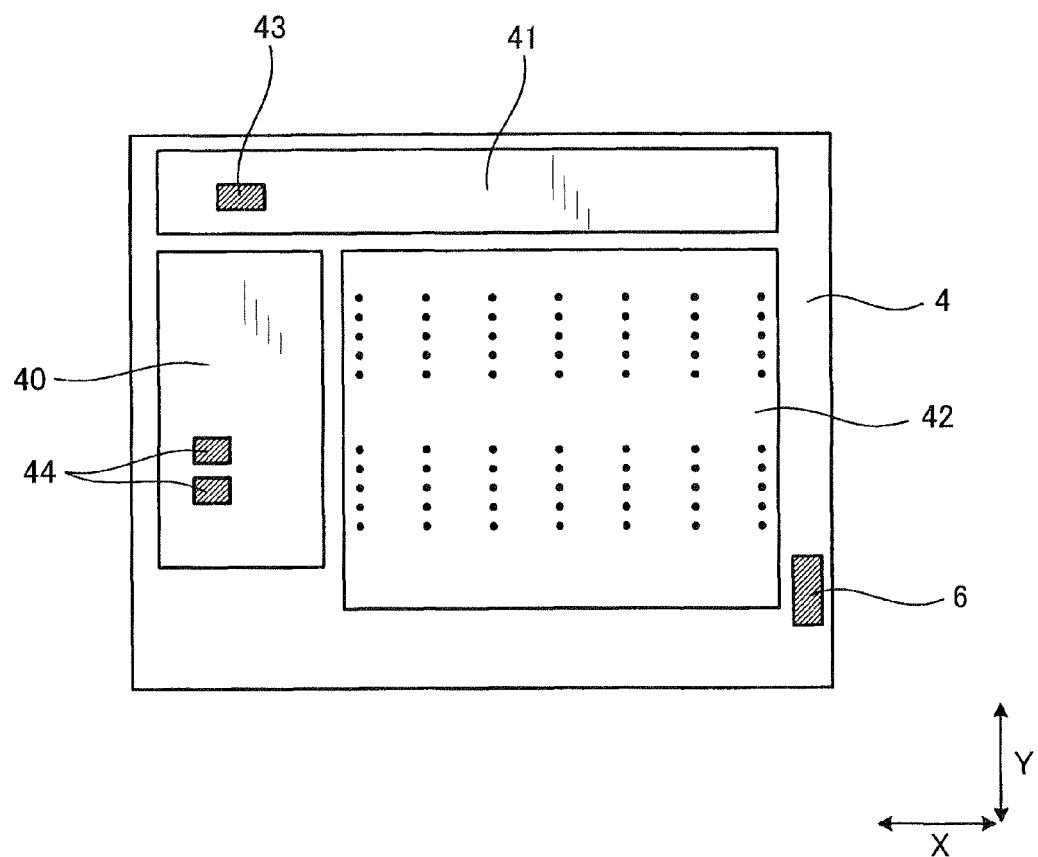
FIG. 5 is a plan view which illustrates a control circuit board installed in the power converter of FIG. 1.
Figure 6:
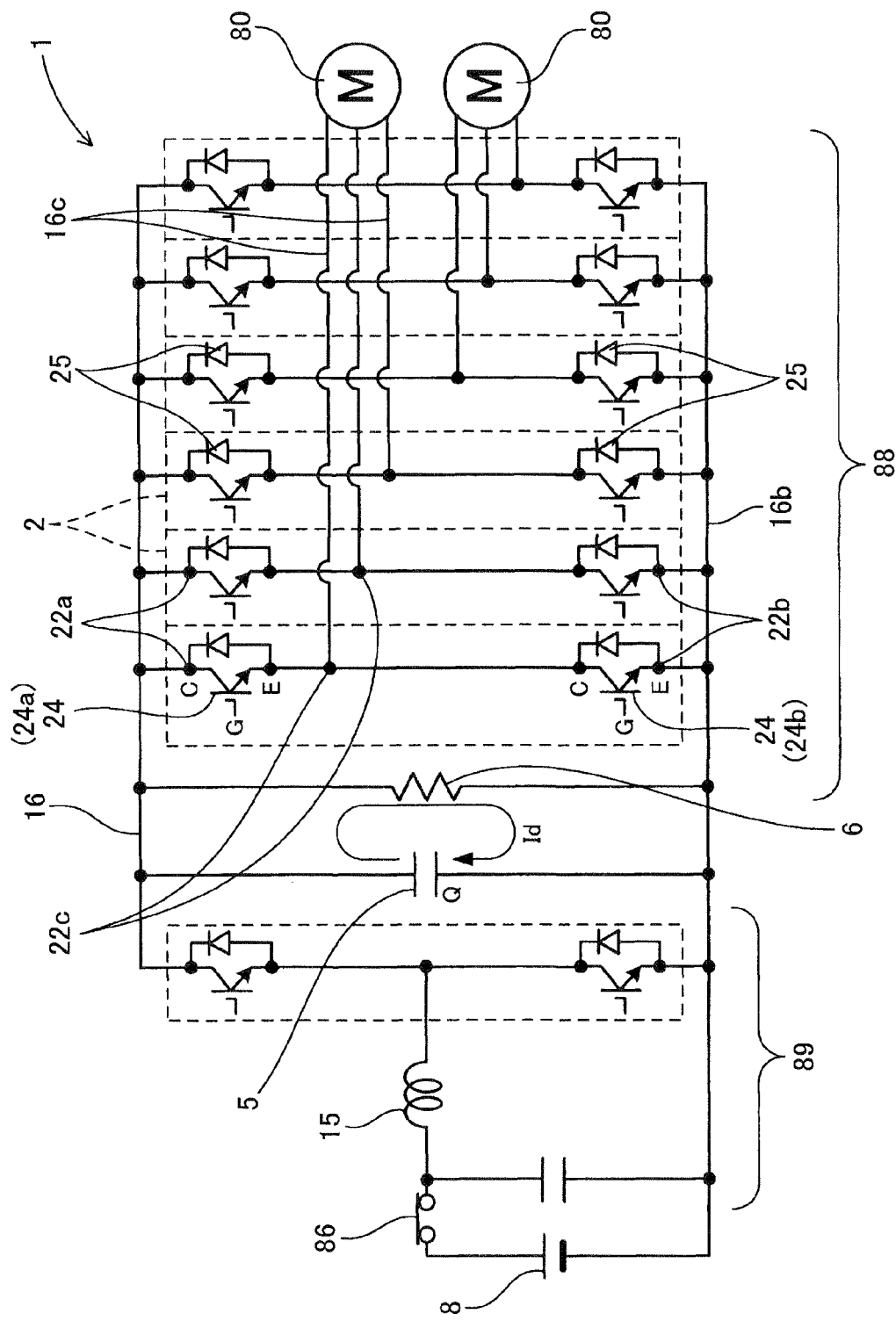
FIG. 6 is a circuit diagram which illustrates an electric structure of the power converter of FIG. 1.

Referring to the drawings, wherein like reference numbers refer to like parts in several views, particularly to FIGS. 1 to 10, there is shown a power converter 1 which may be mounted in automotive vehicles such as electric vehicles or hybrid vehicles. The power converter 1 is, as illustrated in FIGS. 1 to 4, equipped with a plurality of semiconductor modules 2, a cooling device 3, a smoothing capacitor 5, a control circuit board 4, and a discharging resistor 6. Each of the semiconductor modules 2 includes a main unit 2 in which semiconductor devices, as illustrated in FIG. 6, are fabricated. The main unit 2 has control terminals 21 and power terminals 22 extending therefrom.

The smoothing capacitor 5 works to smooth the DC voltage applied to the semiconductor modules 2.

The control circuit board 4 has fabricated thereon a control circuit, as will be described later in detail, which controls on/off operations of the semiconductor modules 2 in a conventional manner.

The discharging resistor 6 is mounted on the control circuit board 4 in parallel electric connection to the smoothing capacitor 5. The control circuit board 4 is equipped with a timing controller 41, a driver 42, and a power supply circuit 40. The timing controller 41 works to control the timing of the on/off operations of the semiconductor modules 2. The driver 42 is coupled with the control terminals 21 and controls the voltage to be applied to the control terminals 21. The power supply circuit 40 transforms the voltage inputted into the control circuit board 4 and produces operating voltage for the timing controller 41 and the driver 42.

The driver 42 is disposed between at least one of the timing controller 41 and the power supply circuit 40 and the discharging resistor 6.

Figure 3:
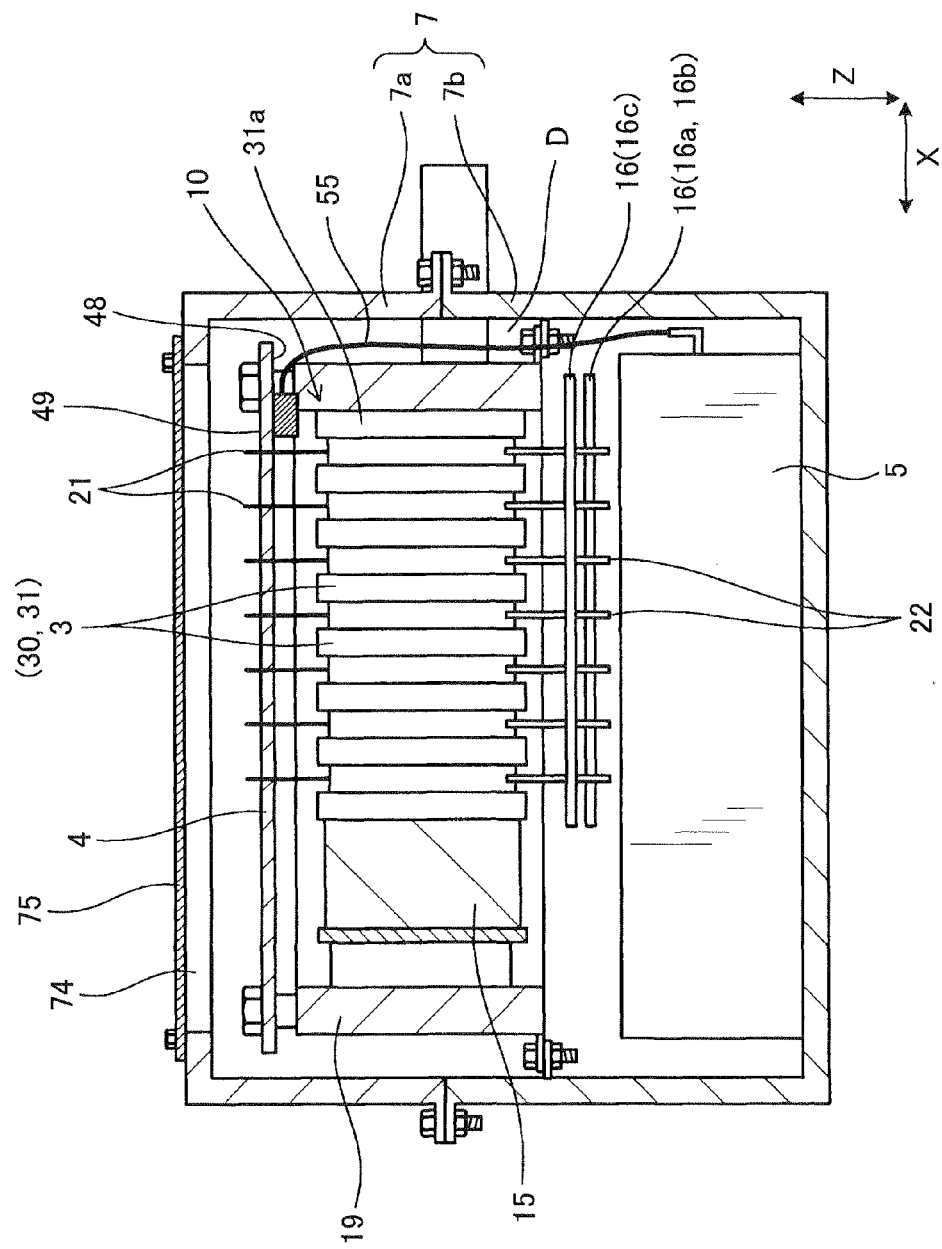
FIG. 3 is a sectional view taken along the line B-B in FIG. 1.

The power converter 1 is, as illustrated in FIGS. 3 and 4, equipped with a semiconductor stack 10 made up of the semiconductor modules 2 and cooling pipes 31 which define cooling paths 30. The cooling paths 30 constitute the cooling device 3. The semiconductor stack 10 is retained within a metallic frame 19 together with a reactor 15. The reactor 15 is disposed adjacent the semiconductor stack 10 in alignment with a length of the semiconductor stack 10, in other words, a direction in which the semiconductor modules 2 are laid to overlap each other (i.e., X-direction in the drawings).

Figure 1:
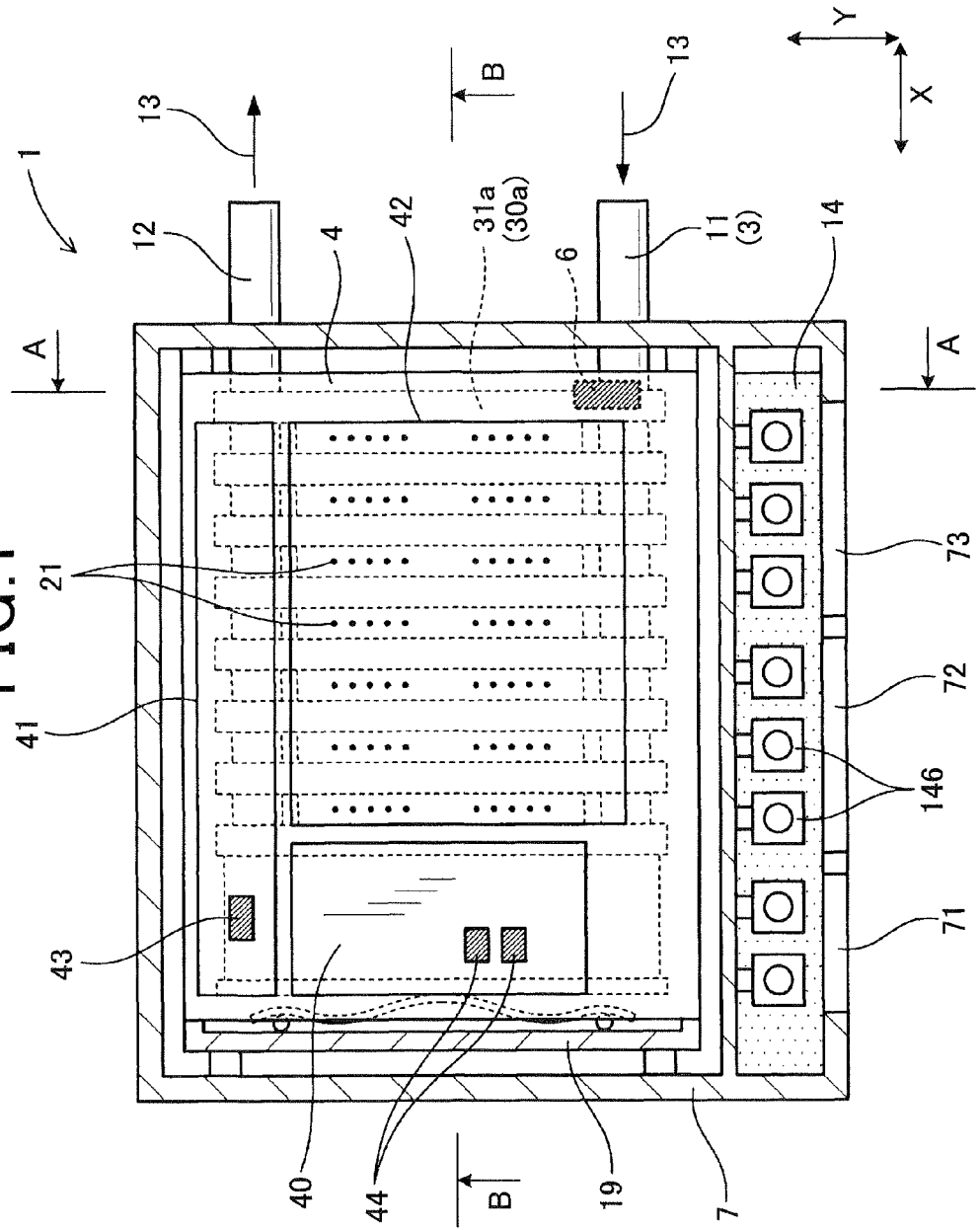
FIG. 1 is a sectional view, as taken along the line C-C in FIG. 2, which illustrates a power converter according to the first embodiment.
Figure 2:
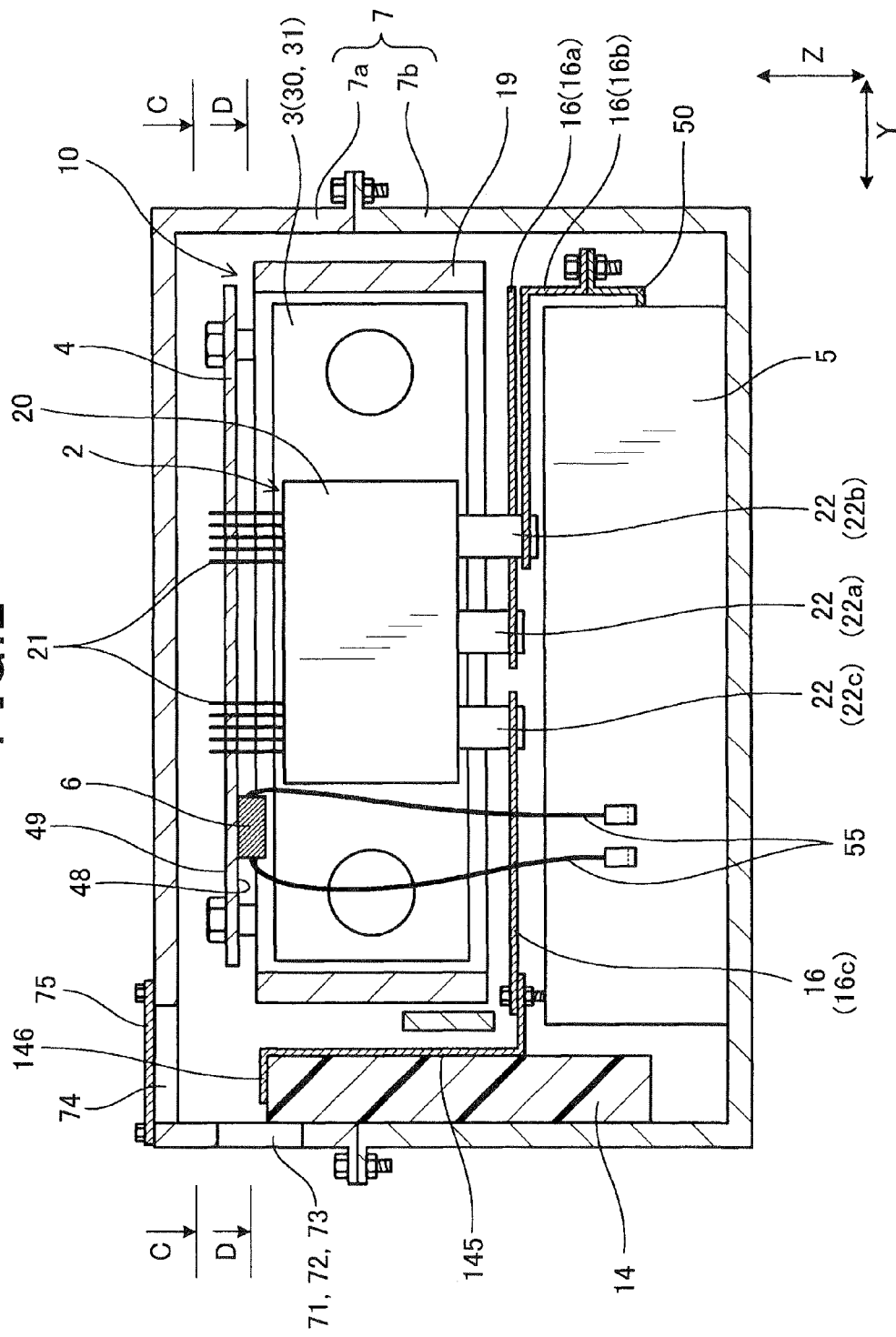
FIG. 2 is a sectional view taken along the line A-A in FIG. 1.

The control circuit board 4 is, as illustrated in FIGS. 1 to 3, arranged in parallel both to the lengthwise direction of the cooling paths 30 (i.e., the Y-direction) and to a direction in which the semiconductor modules 2 are stacked (i.e., the X-direction). The control circuit board 4 is laid to overlap the semiconductor stack 10 and the reactor 15 in the thicknesswise direction thereof (i.e., Z-direction).

The cooling pipes 31, as illustrated in FIG. 4, extend in the Y-direction and are joined together at ends thereof through connecting pipes 18 (i.e., 18a and 18b). Between a set of the first connecting pipes 18a and a set of the second connecting pipes 18b, the semiconductor modules 2 are arrayed.

The outermost one of the cooling pipes 31 in the X-direction, that is, the cooling pipe 31a is joined to an inlet pipe 11 through which the coolant 13 is loaded into the semiconductor stack 10 and an outlet pipe 12 from which the coolant 13 is discharged outside the semiconductor stack 10. The inlet pipe 11 is joined to an end of the cooling pipe 31a extending in the Y-direction. The outlet pipe 12 is joined to the other end of the cooling pipe 31a. All the first connecting pipes 18a and the inlet pipe 11 extend in alignment with each other in the X-direction. Similarly, all the second connecting pipes 18b and the outlet pipe 12 extend in alignment with each other in the X-direction. After entering the inlet pipe 11, the coolant 13 is distributed to all the cooling pipes 31 through the connecting pipes 18 and flows out of the outlet pipe 12, thereby absorbing the thermal energy, as produced by the semiconductor modules 2, to cool the whole of the semiconductor stack 10.

Each of the semiconductor modules 2 is, as illustrated in FIG. 2, equipped with the control terminals 21 and the power terminals 22. The control terminals 21 and the power terminals 20 protrude in opposite directions along the thicknesswise direction of the control circuit board 4 (i.e., Z-direction). The power terminals 22 of each of the semiconductor modules 20 include a positive terminal 22a which connects with a positive electrode of the DC power supply 8, as illustrated in FIG. 6, a negative terminal 22b which connects with a negative electrode of the DC power supply 8, and an ac (alternating current) terminal 22c which connects with one of ac loads 80. The control terminals 21 are, as described above, joined to the control circuit board 14. The control circuit board 14 works to control the on/off operations of the semiconductor modules 2 to convert the dc voltage applied to the positive terminal 22a and the negative terminal 22b into an ac form. The ac voltage is then outputted from the ac terminal 22c.

A positive bus bar 16a is coupled to the positive terminal 22a of each of the semiconductor modules 2. A negative bus bar 16b is coupled to the negative terminal 22b of each of the semiconductor modules 2. An ac bus bar 16c is connected to the ac terminal 22c of each of the semiconductor modules 2.

The smoothing capacitor 5 is located on the opposite side of the semiconductor stack 10 to the control circuit board 4 in the Z-direction. The smoothing capacitor 5 is equipped with a pair of connecting terminals 50 to which the positive bus bar 16a and the negative bus bar 16b are joined, respectively.

The smoothing capacitor 5 is connected electrically to the discharging resistor 6 through wires 55.

Connecting bus bars 145 are coupled to the positive bus bar 16a, the negative bus bar 16b, and the ac bus bars 16c. Terminals 146 of the connecting bus bars 145 are mounted on a resinous terminal table 14.

The control circuit board 4 is, as described in FIGS. 1 and 5, equipped with the timing controller 41, the driver 42, and the power supply circuit 40. The timing controller 41 includes a microcomputer 43. The power supply circuit 40 includes electrolytic capacitors 44. The driver 42 is disposed between the timing controller 41 and the discharging resistor 6 and between the power supply circuit 40 and the discharging resistor 6.

Figure 7:
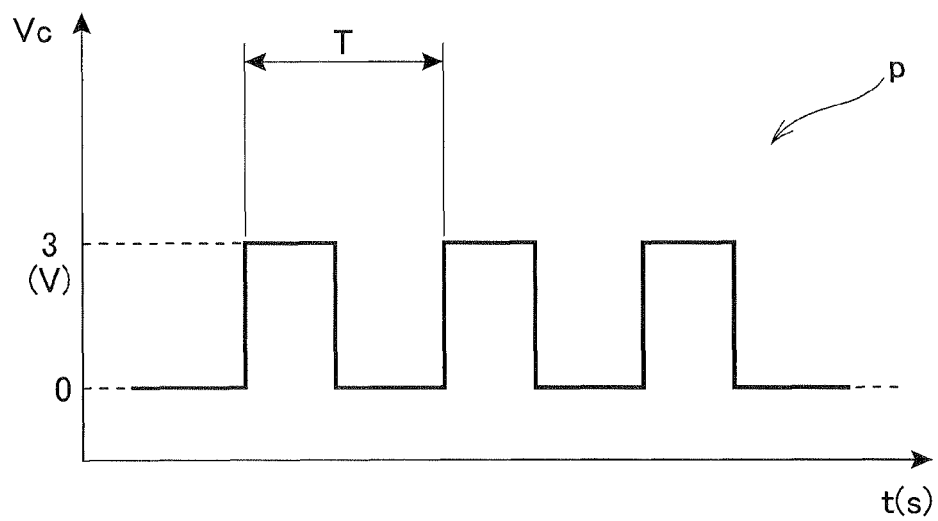
FIG. 7 is a view which illustrates a waveform of a pulse outputted by a timing controller installed in the power converter of FIG. 1.
Figure 8:
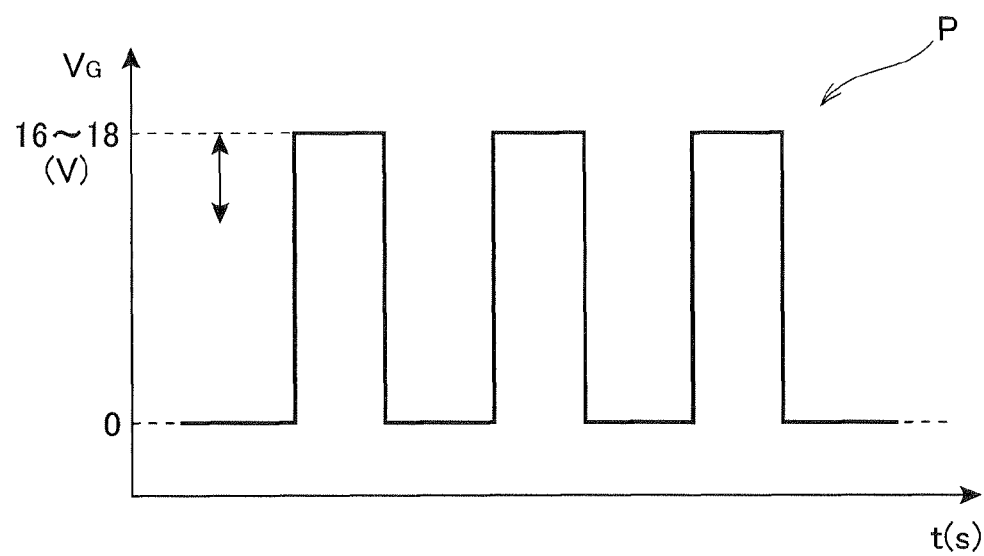
FIG. 8 is a view which illustrates a waveform of a pulse outputted by a driver installed in the power converter of FIG. 1.

The timing controller 41 works to produce a control pulse p, as illustrated in FIG. 7, to turn on or off each of the semiconductor modules 2 and transmit it to the driver 42. The control pulse p has a controlled duty cycle and sets an on/off cycle T of the semiconductor module 2. The voltage $V_C$ of the control pulse p is approximately 3V. The driver 42 is responsive to the control pulse p to produce an operating pulse P, as illustrated in FIG. 8, which is identical in on/off cycle T and duty cycle with the control pulse p, but has voltage $V_G$ which is different in level from the voltage $V_C$. The voltage $V_G$ of the operating pulse P is applied to a control terminal (i.e., a gate) of each of the semiconductor modules 2 (i.e., IGBTs).

The driver 42 controls the level of the voltage $V_G$ so as to bring an on-current $I_{CE}$ for the semiconductor module 2 (i.e., IGBTs) into agreement with a given value. The voltage $V_G$ is regulated in a range of, for example, 16V to 18V. The driver 42 also controls current $I_G$ flowing through the control terminals 21 (i.e., the gates) so that the on-current $I_{CE}$ has the given value.

The operating voltage for the timing controller 41 is approximately 5V. The operating voltage for the driver 42 is approximately 17V. The voltage applied to the power supply circuit 40 on the control circuit board 4 is approximately 15V. The power supply circuit 40 is equipped with an step-up transformer and a step-down transformer. The step-down transformer works to step-down the input voltage (15V) to produce the operating voltage (5V) for the timing controller 41. The step-up transformer works to step-up the input voltage (15V) to produce the operating voltage (17V) for the driver 42.

The timing controller 41 uses the microcomputer 43 to produce the pulse p. The power supply circuit 40 uses the electrolytic capacitors 44 to make the step-up and step-down transformers. The microcomputer 43 and the electrolytic capacitors 44 are sensitive to heat. When the smoothing capacitor 5 is discharged, the current, as released from the smoothing capacitor 5, flows through the discharging resistor 6, so that it heats. In order to protect the microcomputer 43 and the electrolytic capacitors 44 from the heat, as produced by the discharging resistor 6, the discharging resistor 6 is located well away from the microcomputer 43 and the electrolytic capacitors 44.

The control circuit board 4, as clearly illustrated in FIGS. 2 and 3, has opposed major surfaces 48 and 49. The discharging resistor 6 is mounted on the major surface 48 closer to the cooling device 3 than the major surface 49 is.

The discharging resistor 6 is, as described above in FIG. 9, laid to overlap with, in other words, in coincidence with the cooling device 3, as viewed from the Z-direction. Specifically, the discharging resistor 6 is located to at least partially overlap the inlet pipe 11 in the Z-direction.

Additionally, as viewed from the Z-direction, the discharging resistor 6 is also arranged to overlap an outermost one 30a of the cooling paths 30 arrayed in the X-direction. The cooling path 30a is formed in the cooling pipe 31a to which the inlet pipe 11 and the outlet pipe 12 are joined directly.

The frame 19, as illustrated in FIG. 4, has end walls 191 and 192 extending perpendicular to the X-direction. An elastic member (e.g., a leaf spring) 17 is disposed between the end wall 191 and the reactor 15. The elastic member 17 urges the semiconductor stack 10 and the reactor 15 elastically against the end wall 192, thereby retaining the semiconductor stack 10 and the reactor 15 within the frame 19.

The power converter 1 also includes, as illustrated in FIG. 2 a converter casing 7 made by a combination of a first case 7a and a second case 7b which are joined together through bolts. The first case 7a has three connector inlet holes (i.e., openings) 71, 72, and 73, as illustrated in FIG. 1, and a bolt inlet hole 74. The joining of the power converter 1 to the DC power supply 8 (see FIG. 6) and the ac loads 80 is achieved by inserting connectors (not shown) of the DC power supply 8 into the first connector inlet hole 71, inserting connectors (not shown) of the ac loads 80 into the second connector inlet hole 72 and the third connector inlet hole 73, inserting bolts into the bolt inlet hole 74, and then fastening the bolts to join the terminals 146 of the connecting bus bars 145 and the connectors together. Afterwards, the bolt inlet hole 74 is closed by a cover 75.

An electric circuit of the power converter 1 will be described below. The power converter 1 is, as can be seen in FIG. 6, equipped with a converter 89 working to step-up the dc voltage, as produced by the DC power supply 8 and an inverter 88 working to transform the stepped-up dc voltage into an ac form. Each of the semiconductor modules 2 includes two semiconductor devices 24 (e.g., IGBTs): one being an upper arm semiconductor device 24a connecting with the positive bus bar 16a, and the other being a lower arm semiconductor device 24b connecting with the negative bus bar 16b. Freewheel diodes 25 are connected in inverse parallel to the semiconductor devices 24, respectively. The collectors of the upper arm semiconductor devices 24a serve as the positive terminals 22a. The emitters of the lower arm semiconductor devices 24b serve as the negative terminals 22b. The emitters of the upper arm semiconductor devices 24a and the collectors of the lower arm semiconductor devices 24b are connected to the ac terminals 22c.

The smoothing capacitor 5 is connected between the positive bus bar 16a and the negative bus bar 16b. The discharging resistor 6 is connected to the smoothing capacitor 5 in parallel thereto.

When it is required to actuate the power converter 1, a relay 86 is turned on to step-up the dc voltage, as produced by the DC power supply 8, through the converter 89. The stepped-up dc voltage is smoothed by the smoothing capacitor 5. The inverter 88 transforms the smoothed dc voltage into an ac voltage. During actuation of the power converter 1, the electric charge Q, as stored in the smoothing capacitor 5, is released little by little as a discharged current Id to the discharging resistor 6.

When it is required to stop the power converter 1, the relay 86 is turned off. The electric charge Q continues to flow out of the smoothing capacitor 5 as the discharged current Id and then disappears immediately after the relay 86 is turned off. This results in a quick drop in voltage at the smoothing capacitor 5, thereby minimizing the danger of electrical shocks.

The discharged current Id, as described above, continues to flow through the discharging resistor 6 while the power converter 1 is running, but a switch (not shown) may be disposed between the discharging resistor 6 and the positive bus bar 16a to disconnect the discharging resistor 6 from the smoothing capacitor 5 to cut the flow of the discharged current Id during the actuation of the power converter 1. After the power converter 1 stops, the switch may be turned off or closed to permit the discharged current Id to flow to the discharging resistor 6.

The operation and beneficial advantages of the structure of the power converter 1 will be described below.

The driver 42 is, as described above in FIG. 1, disposed between at least one of the timing controller 41 and the power supply circuit 40 and the discharging resistor 6, thereby protecting the timing controller 41 and/or the power supply circuit 40 mounted on the control circuit board 4 from thermal energy radiating from the discharging resistor 6. Specifically, the driver 42 is joined to the control terminals 21 of the semiconductor modules 2 which are cooled by the cooling device 3, so that the temperature of the driver 42 is kept at a relatively low level, while the timing controller 41 and the power supply circuit 40 do not lead to the control terminals 21, so that the temperature thereof will be elevated more easily than the driver 42. In order to alleviate this problem, the driver 42 is disposed between at least one of the timing controller 41 and the power supply circuit 40 and the discharging resistor 6 to serve as a thermal shield to protect the timing controller 41 and/or the power supply circuit 40 from the heat, as produced by the discharging resistor 6. This minimizes the probability of thermal malfunction of or damage to the timing controller 41 and/or the power supply circuit 40.

If the discharging resistor 6 is mounted in the converter casing 7, it will be necessary to increase the volume of the converter casing 7 to secure an installation space for the discharging resistor 6, thus resulting in an increase in overall size of the power converter 1. The power converter 1 of this embodiment is, however, designed to have the discharging resistor 6 disposed on the control circuit board 4, thus eliminating the need for the installation space and permitting the power converter 1 to be reduced in size.

The driver 42 is, as described above, disposed between the timing controller 41 and the discharging resistor 6 and between the power supply circuit 40 and the discharging resistor 6. This protects both the timing controller 41 and the driver 42 from thermal energy radiated by the discharging resistor 6, thus reducing the probability of malfunction of the control circuit board 4.

The timing controller 41 is equipped with the microcomputer 43 which is usually sensitive to heat. The driver 42 is disposed between the microcomputer 43 and the discharging resistor 6, thus protecting the microcomputer 43 from the thermal energy radiated by the discharging resistor and reducing the the probability of malfunction of the control circuit board 4.

The power supply circuit 40 is equipped with the electrolytic capacitors 44 which are usually sensitive to heat. The driver 42 is disposed between the electrolytic capacitors 44 and the discharging resistor 6, thus protecting the electrolytic capacitors 44 from the thermal energy radiated by the discharging resistor and reducing the probability of malfunction of the control circuit board 4.

The discharging resistor 6 is, as illustrated in FIGS. 2 and 3, mounted on the major surface 48 which is closer to the cooling device 3 than the major surface 49 is. In other words, the discharging resistor 6 is located close to the cooling paths 30, thereby enhancing the efficiency in cooling the discharging resistor 6 to minimize the adverse effects on the control circuit board 4 which arises from the radiation of heat from the discharging resistor 6.

The discharging resistor 6 is, as described above in FIG. 9, laid to partially overlap with the cooling device 3, as viewed from the Z-direction. This permits the distance between the discharging resistor 6 and the cooling device 3 to be minimized, thereby facilitating the cooling of the discharging resistor 6 to minimize the adverse effects on the control circuit board 4 which arises from the radiation of heat from the discharging resistor 6.

The discharging resistor 6 is, as described above in FIG. 9, laid to partially overlap with the inlet pipe 11, as viewed from the Z-direction. This facilitates the cooling of the discharging resistor 6. Specifically, after entering the inlet pipe 11, the coolant 13 flows through the cooling device 3 to absorb the thermal energy from the semiconductor modules 2 and, after being elevated in temperature, goes outside the cooling device 3 through the outlet pipe 12. The temperature of the coolant 13 is, therefore, minimized in the inlet pipe 12, while it is maximized in the outlet pipe 12. The discharging resistor 6 of the power converter 1 is, thus, disposed to overlap the inlet pipe 11 in the Z-direction, that is, near a place where the temperature of the coolant 13 is the lowest, thereby enhancing the efficiency in cooling the discharging resistor 6.

Figure 13:
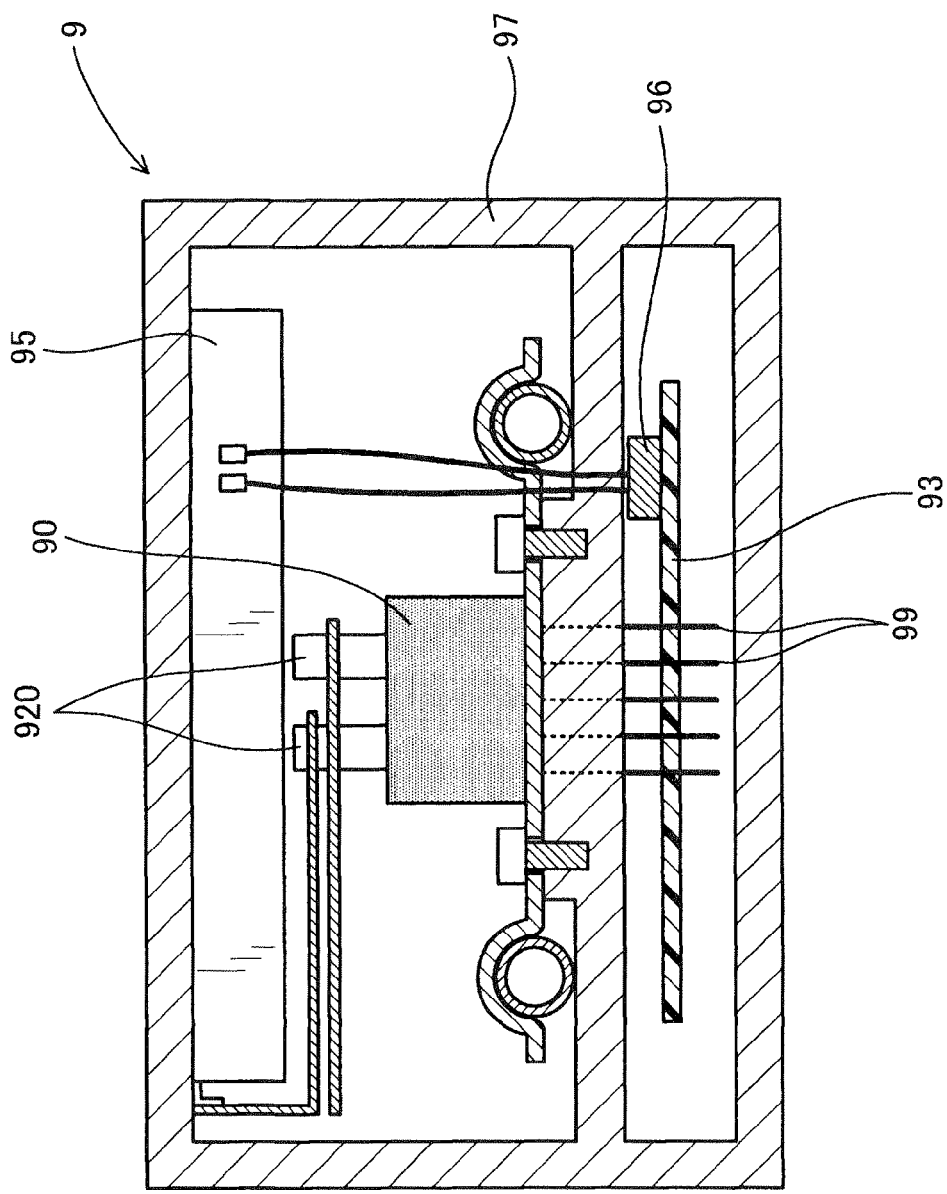
FIG. 13 is a transverse sectional view which illustrates a conventional power converter.

The power converter 1 is, as illustrated in FIGS. 1 to 3, equipped with the semiconductor stack 10. The control circuit board 4 is oriented in parallel both to the Y-direction and to the X-direction. For example, the power converter 1 may be, as illustrated in FIG. 13, made without the semiconductor stack 10 and designed to lay the cooling device 3, the semiconductor modules 2, and the control circuit board 4 to overlap each other in the Z-direction, but the semiconductor modules 2 are disposed between the cooling device 3 and the control circuit board 4, thus resulting in a difficulty in mounting the control circuit board 4 (i.e., the discharging resistor 6) close to the cooling device 3, which may lead to a lack in cooling the discharging resistor 6. The power converter 1 of this embodiment is, however, engineered not to have the semiconductor modules 2 interposed between the control circuit board 4 and the cooling device 3, thus enabling the control circuit board 4 to be located close to the cooling device 3. In other words, the discharging resistor 6 on the control circuit board 4 is close to the cooling device, thereby enhancing the efficiency in cooling the discharging resistor 6.

Figure 9:
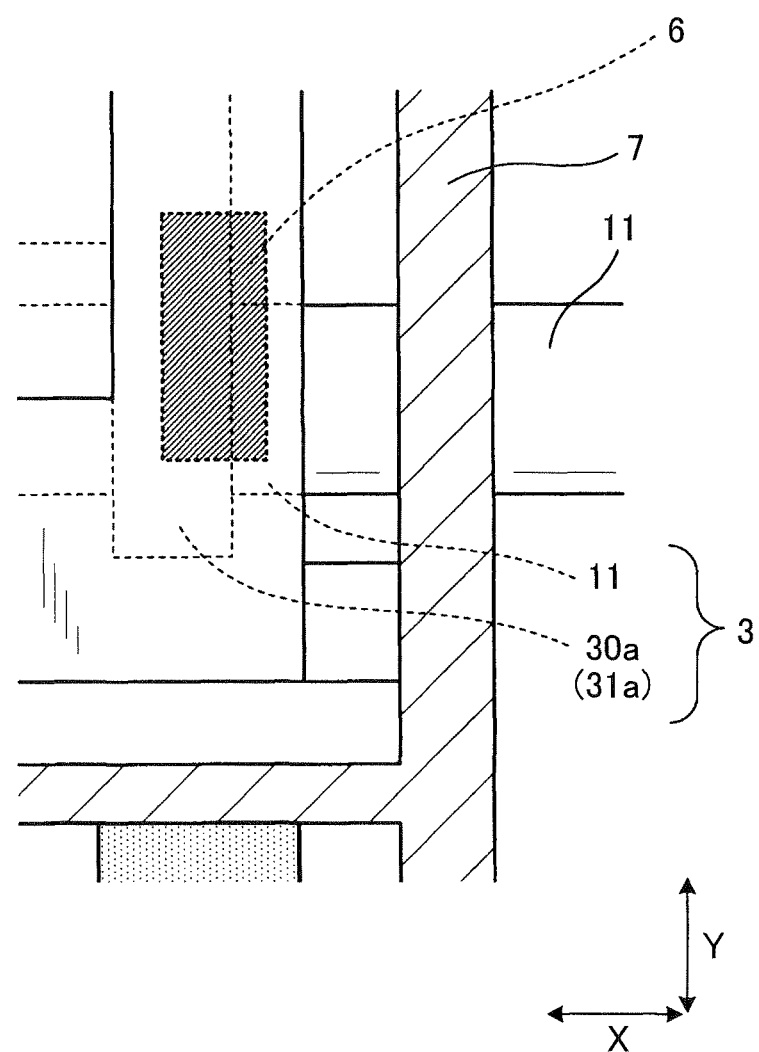
FIG. 9 is an enlarged sectional view which illustrates a location of a discharging resistor installed in the power converter of FIG. 1.

Additionally, as viewed from the Z-direction in FIGS. 1 and 9, the discharging resistor 6 is also arranged to overlap the outermost cooling path 30a. The cooling pipe 31a forming therein the cooling path 30a has only one side area abutting the semiconductor modules 2 in the X-direction, so that it undergoes less thermal effects than the other cooling pipes 31 which are exposed directly at both side areas thereof to the semiconductor modules 2. The temperature of the coolant 13 in the cooling path 30a is, therefore, less elevated. This enhances the efficiency in cooling the discharging resistor 6 disposed close to the cooling path 30a.

Figure 10:
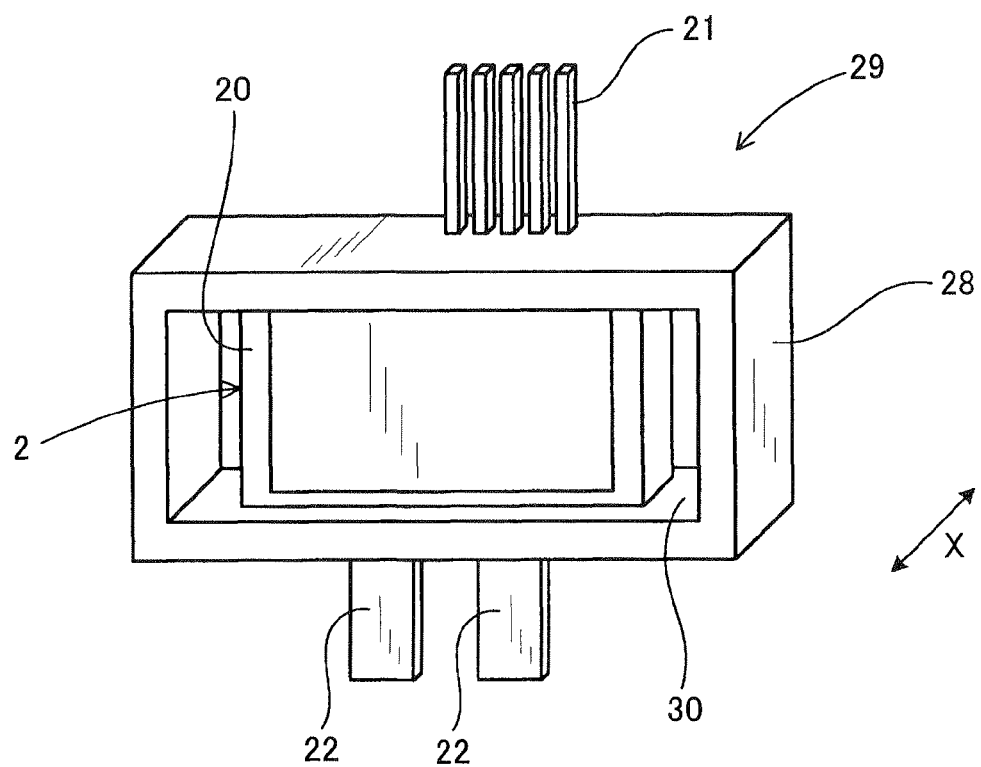
FIG. 10 is a perspective view which illustrates a modification of semiconductor modules installed in the power converter of FIG. 1.

The semiconductor stack 10 is, as described above, made up of the cooling pipes 31 and the semiconductor modules 2 which are laid to overlap each other, but however, it may be built up, as illustrated in FIG. 10, from a plurality of cooler/semiconductor modules 29 each of which is made by an assembly of the unit 20 in which semiconductor devices are mounted and a frame 28. The frame 28 is greater in width than the unit 21 in the X-direction. The unit 20 is so disposed inside the frame 28 as to define chambers which form the cooling paths 30.

Figure 11:
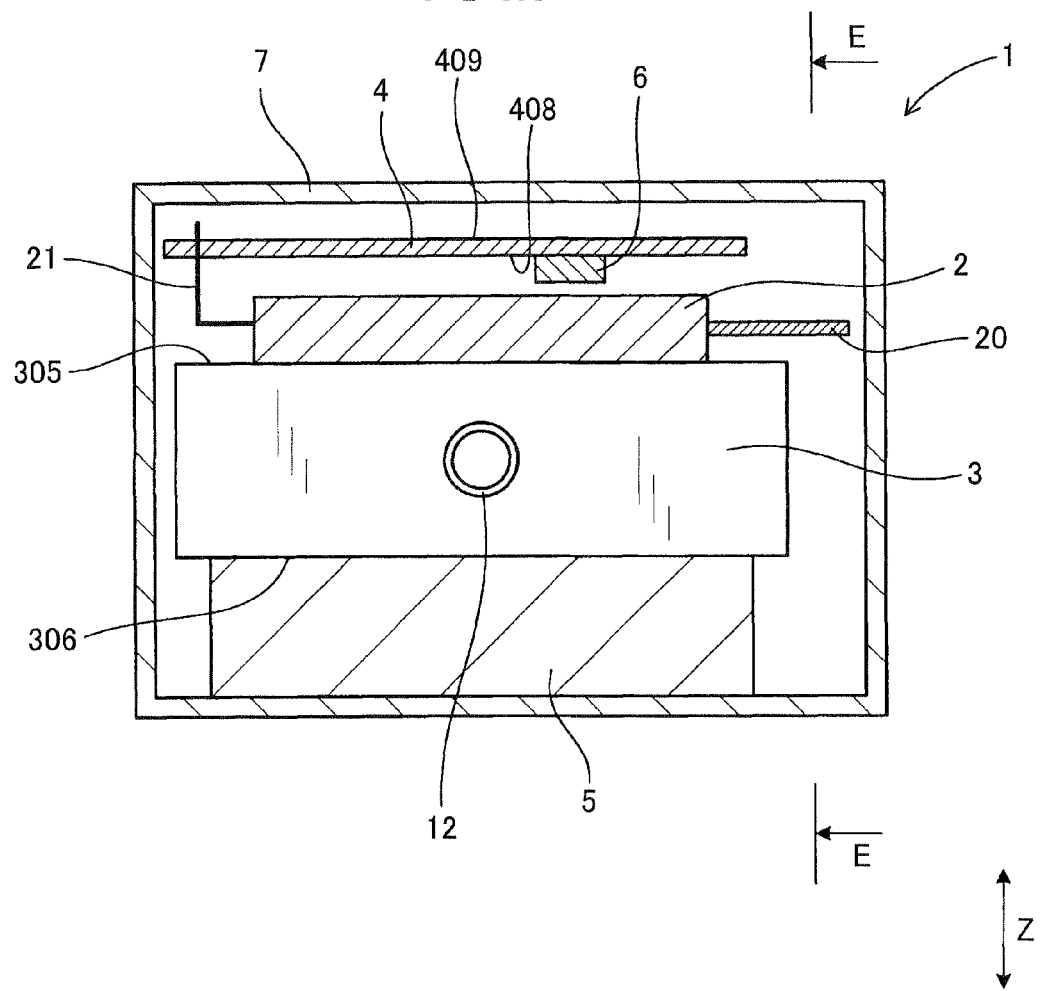
FIG. 11 is a side view which illustrates a power converter according to the second embodiment.
Figure 12:
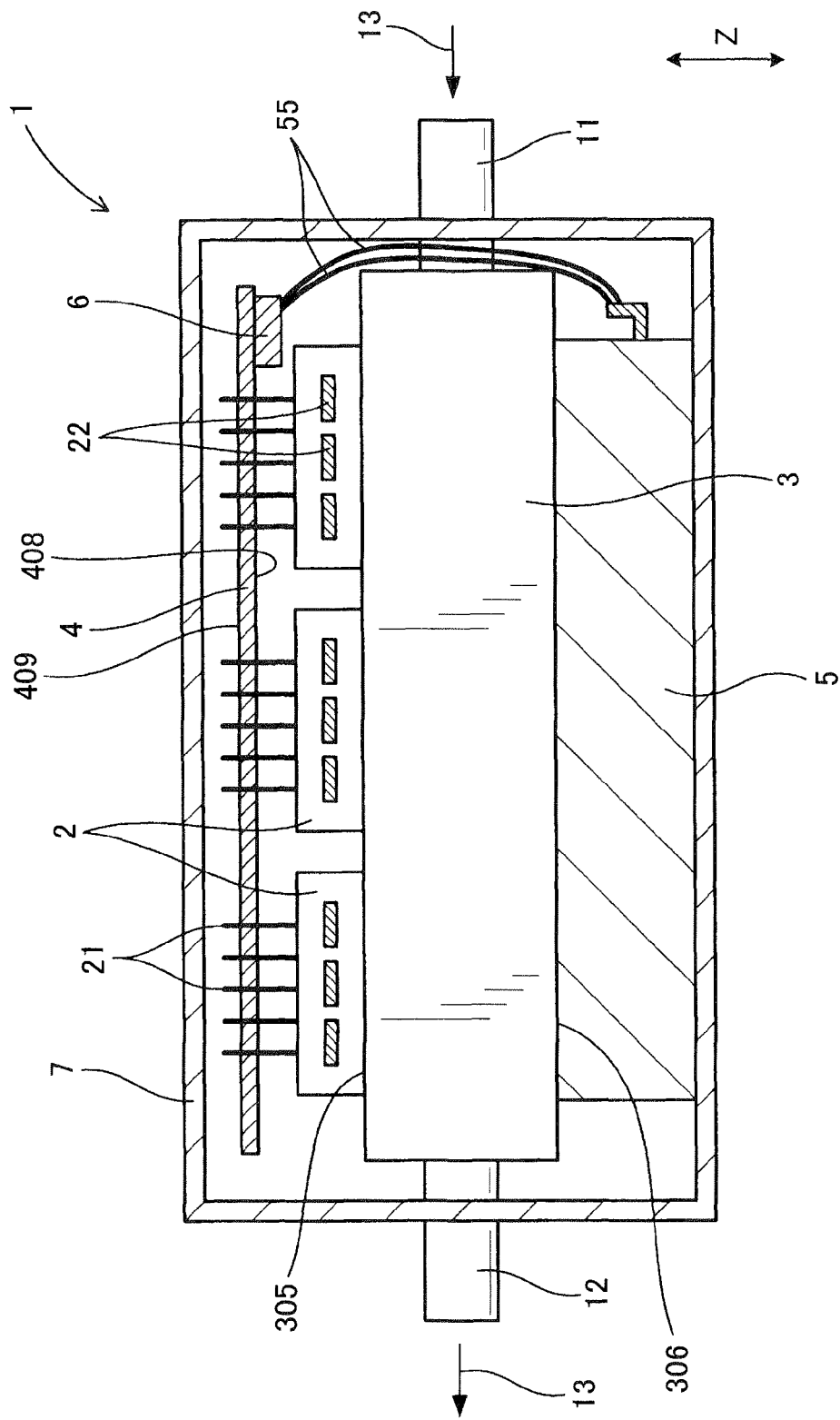
FIG. 12 is a longitudinal sectional view taken along the line E-E in FIG. 11.

FIGS. 11 and 12 illustrate the power converter 1 of the second embodiment. The same reference numbers, as employed in the first embodiment, refer to the same parts, and explanation thereof in detail will be omitted here.

The power converter 1 of this embodiment is different in structure of the cooling device from that of the first embodiment. Specifically, the cooling device 3 is of a cuboid shape and has opposed major surfaces 305 and 306. On the major surface 305, the semiconductor modules 2 are arranged. The control terminals 21 of the semiconductor modules 2 are bent into an L-shape to have top portions extending in a direction normal to the major surface 305 (i.e., the Z-direction). The control circuit board 4 is joined to the control terminals 21. The semiconductor modules 2 are arrayed between the control circuit board 4 and the cooling device 3 which are laid to overlap each other in the Z-direction. The control circuit board 4 has opposed major surfaces 408 and 409. The discharge resistor 6 is mounted on the major surface 408 which is closer to the cooling device 3 than the major surface 409 is.

On the major surface 306 of the cooling device 3 which is opposed to the major surface 305 on which the semiconductor modules 2 are disposed, the capacitor 5 is mounted. The capacitor 5 and the discharging resistor 6 are joined together through the wires 55.

The cooling device 3 is coupled with the inlet pipe 11 and the outlet pipe 12 which are aligned with each other. The coolant 13 enters the inlet pipe 11, flows through the cooling device 3 to absorb the thermal energy, as produced by the semiconductor modules 2 and the capacitor 5, and then goes out of the outlet pipe 12. The capacitor 5, the cooling device 3, the semiconductor modules 2, and the control circuit board 4 are housed within the converter casing 7.

While the present invention has been disclosed in terms of the preferred embodiment in order to facilitate a better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A power converter comprising:
    a plurality of semiconductor modules each of which includes a main unit, control terminals, and power terminals, the main unit having a semiconductor device disposed therein, the control and power terminals protruding from the main unit, wherein the control terminals protrude in a thickness-wise direction from a control circuit board;
    a cooling device which works to cool the semiconductor modules;
    a smoothing capacitor which works to smooth a dc voltage applied to the semiconductor modules;
    a discharging resistor mounted on the control circuit board in parallel connection to the smoothing capacitor;
    a timing controller disposed on the control circuit board, the timing controller working to control timings of on/off operations of the semiconductor modules;
    a driver coupled to the control terminals of the semiconductor modules to control voltage applied to the control terminals; and
    a power supply circuit disposed on the control circuit board, the power supply circuit working to transform a voltage input to the control circuit board into operating voltages for the timing controller and the driver, wherein the driver is disposed between at least one of the timing controller and the power supply circuit and the discharging resistor.

2. A power converter as set forth in claim 1, wherein the driver is located between the timing controller and the discharging resistor and between the power supply circuit and the discharging resistor.

3. A power converter as set forth in claim 1, wherein the timing controller is equipped with a microcomputer, and wherein the driver is disposed between the microcomputer and the discharging resistor.

4. A power converter as set forth in claim 1, wherein the power supply circuit includes an electrolytic capacitor, and wherein the driver is mounted between the electrolytic capacitor and the discharging resistor.

5. A power converter as set forth in claim 1, wherein the control circuit board has opposed major surfaces, and wherein the discharging resistor is mounted on one of the major surfaces of the control circuit board which is closer to the cooling device than the other is.

6. A power converter as set forth in claim 5, wherein the discharging resistor is laid to at least partially overlap the cooling device in a thickness-wise direction of the control circuit board.

7. A power converter as set forth in claim 5, wherein the cooling device includes an inlet pipe to which coolant is supplied for cooling the semiconductor modules and an outlet pipe from which the coolant is discharged, and wherein the discharging resistor is laid to at least partially overlap the inlet pipe in a thickness-wise direction of the control circuit board.

8. A power converter as set forth in claim 5, further comprising a semiconductor stack made up of the semiconductor modules and a plurality of cooling paths through which coolant flows to cool the semiconductor modules, the cooling paths constituting the cooling device, and wherein the control circuit board is laid in parallel both to a direction in which the semiconductor modules and the cooling paths are stacked and to a lengthwise direction of the cooling paths.

9. A power converter as set forth in claim 8, wherein the discharging resistor is laid to overlap one of the cooling paths in a thickness-wise direction of the control circuit board, the one of the cooling paths being an outermost one of the cooling paths in the direction in which the semiconductor modules and the cooling paths are stacked.

* * * * *